United States Patent
Faul et al.

(10) Patent No.: US 9,299,616 B1
(45) Date of Patent: Mar. 29, 2016

(54) INTEGRATED CIRCUITS WITH SEPARATE WORKFUNCTION MATERIAL LAYERS AND METHODS FOR FABRICATING THE SAME

(71) Applicant: GLOBALFOUNDRIES, Inc., Grand Cayman (KY)

(72) Inventors: Juergen Faul, Radebeul (DE); Frank Jakubowski, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/527,867

(22) Filed: Oct. 30, 2014

(51) Int. Cl.
| | |
|---|---|
| *H01L 27/11* | (2006.01) |
| *H01L 21/82* | (2006.01) |
| *H01L 21/8234* | (2006.01) |
| *H01L 21/265* | (2006.01) |
| *H01L 21/28* | (2006.01) |
| *H01L 29/66* | (2006.01) |
| *H01L 21/3213* | (2006.01) |
| *H01L 27/088* | (2006.01) |
| *H01L 29/49* | (2006.01) |
| *H01L 29/423* | (2006.01) |

(52) U.S. Cl.
CPC .. *H01L 21/823437* (2013.01); *H01L 21/26586* (2013.01); *H01L 21/28061* (2013.01); *H01L 21/28114* (2013.01); *H01L 21/28132* (2013.01); *H01L 21/32139* (2013.01); *H01L 21/823418* (2013.01); *H01L 21/823468* (2013.01); *H01L 27/088* (2013.01); *H01L 29/42376* (2013.01); *H01L 29/4925* (2013.01); *H01L 29/66545* (2013.01)

(58) Field of Classification Search
CPC ..... H01L 27/11; H01L 27/088; H01L 27/105; H01L 21/823462; H01L 21/823857
USPC .......................................... 257/347, 369, 392
See application file for complete search history.

(56) References Cited

U.S. PATENT DOCUMENTS

2013/0214358 A1*  8/2013  Jagannathan ....... H01L 29/4908
                                                          257/347

* cited by examiner

*Primary Examiner* — Monica D Harrison
(74) *Attorney, Agent, or Firm* — Ingrassia Fisher & Lorenz, P.C.

(57) ABSTRACT

Integrated circuits employing replacement metal gate technologies with separate workfunction material layers and raised source/drain structures and methods for fabricating the same are disclosed herein. In one exemplary embodiment, a method of fabricating an integrated circuit includes forming a first workfunction material layer over an ILD layer, along the sidewall spacer structures, and over the high-k material layer. The method further includes forming a masking layer over the first workfunction material layer, performing a tilted ion implant wherein ions are implanted at the masking layer over the ILD layer and along the sidewall spacer structures, selectively etching the masking layer and the first workfunction material from over the ILD layer and from along the sidewall spacer structures, and forming a second workfunction material layer over the ILD layer, along the sidewall spacer structures, and over the first workfunction material layer.

20 Claims, 8 Drawing Sheets

INTEGRATED CIRCUITS WITH SEPARATE WORKFUNCTION MATERIAL LAYERS AND METHODS FOR FABRICATING THE SAME

TECHNICAL FIELD

The present disclosure generally relates to integrated circuits and methods for fabricating integrated circuits. More particularly, the present disclosure relates to integrated circuits employing replacement metal gate technologies with separate workfunction material layers and raised source/drain structures.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

The conductivity of the channel region, upon formation of the conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity, are dominant design efforts used to increase the operating speed of the integrated circuits.

For many early integrated circuit device technology generations, the gate electrode structures of most transistor elements have included a plurality of silicon-based materials, such as a silicon dioxide and/or silicon oxynitride gate insulation layer, in combination with a polycrystalline silicon ("polysilicon") gate electrode. However, as the channel length of aggressively scaled transistor elements has become increasingly smaller in order to increase the operating speed, many newer generation devices employ gate electrode stacks including alternative materials in an effort to avoid the short channel effects which may be associated with the use of traditional silicon-based materials in reduced channel length transistors. For example, in some aggressively scaled transistor elements, which may have channel lengths on the order of from about 14 to about 32 nm, gate electrode stacks including a so-called high-k dielectric/metal gate (HK/MG) configuration have been shown to provide significantly enhanced operational characteristics over the heretofore more commonly used silicon dioxide/polysilicon (SiO/poly) configurations. One well-known processing method that has been used for forming a transistor with a high-k/metal gate structure is the so-called "gate last" or "replacement gate" technique.

Even with the use of replacement metal gate technologies, conventional contact structures that are used to connect to the source and drain regions of the transistors began to limit device performance in several ways. First, it was not possible to minimize the contact resistance, if the contact hole was also of minimum size, and problems with cleaning the small contact holes became a concern. In addition, the area of the source/drain regions could not be minimized because the contact hole had to be aligned to these regions with a separate masking step, and extra area had to be allocated for misalignment, which resulted in increased source/drain-to-substrate junction capacitance and decreased the speed of the device. When non-minimum-width MOSFETs were manufactured with conventional contacts, several small, uniform sized contact holes were usually used rather than one wider contact hole. The problem with using several small, equally sized contact holes rather than one wider one, was that the full width of the source/drain region was thus not available for the contact structure. As a result, the device contact resistance was proportionally larger than it would have been in a device having minimum width.

A proposed method of solving the problem associated with shrinking the MOSFET involves selective growth of silicon and diffusion of the implanted dopants to form the junctions. In this approach, silicon is selectively grown (SSG) over the source/drain regions of the MOSFET to a depth of, for example, about 200 to about 400 nm, following the completion of oxide-spacer formation. The SSG step produces what is known in the art as "raised" source/drain regions, which assist in alleviating the aforementioned contact size problems in smaller-scale devices.

The use of raised source/drain structures in connection with high-k/metal gate process flows, however, has given rise to further operational problems. For example, the conductive contact plugs that are used for electrical connection to the source/drain regions create an undesirable capacitor (two conductors separated by a dielectric material) between the metal gate electrode and the conductive contact plugs. This undesirable "fringe" capacitor must be charged and discharged every switching cycle of the transistor. Such problems may result in a circuit exhibiting longer rise/fall times for a given switching cycle, and hence slower operating speeds.

Accordingly, with the increasing use of raised source/drain structures in high-k/metal gate process flows, it is desirable to provide techniques and structures that avoid the undesirable fringe capacitance that has been experienced in prior art techniques and structures. Additionally, it is desirable to provide methods for the fabrication of such structures that are easily integrated into existing process flow schemes used in semiconductor fabrication facilities. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits employing replacement metal gate technologies with separate workfunction material layers and raised source/drain structures and methods for fabricating the same are disclosed herein. In one exemplary embodiment, a method of fabricating an integrated circuit includes forming raised source and drain regions adjacent to a dummy gate electrode structure upon a semiconductor substrate, the dummy gate electrode structure being formed between sidewalls spacer structures and an inter layer dielectric (ILD) layer upon the semiconductor substrate, removing the dummy gate electrode structure to form a recess between the sidewall spacer structures and exposing a high-k material layer at a bottom portion of the recess, and forming a first workfunction material layer over the ILD layer, along the sidewall spacer structures, and over the high-k material layer. The method further includes forming a masking layer over the first workfunction material layer, performing a tilted ion implant wherein ions are implanted at the masking layer over the ILD layer and along the sidewall spacer structures, while leaving the bottom portion of the recess free from the tilted ion implant, selectively etching the masking layer and the first workfunction material from over the ILD layer and from along the sidewall spacer structures, thereby leaving the first workfunction material layer disposed only over the high-k material layer at the bottom portion of the recess, and forming a second workfunction material layer over the ILD layer, along the sidewall spacer structures, and over the first workfunction material layer. Still further, the method includes forming a metal gate electrode structure to fill the recess.

In another exemplary embodiment, a method of fabricating an integrated circuit includes forming raised source and drain regions adjacent to a dummy gate electrode structure upon a semiconductor substrate, the dummy gate electrode structure being formed between first sidewalls spacer structures and an inter layer dielectric (ILD) layer upon the semiconductor substrate, removing the dummy gate electrode structure to form a recess between the first sidewall spacer structures and exposing a high-k material layer at a bottom portion of the recess, and forming a first workfunction material layer over the ILD layer, along the first sidewall spacer structures, and over the high-k material layer. The method further includes forming second sidewall spacer structures along the first workfunction material layer, leaving the first workfunction material layer exposed at a bottom portion of the recess, removing the first workfunction material layer from the bottom portion of the recess to re-expose the high-k material layer, and removing the second sidewall spacer structures. Still further, the method includes forming a second workfunction material layer over the high-k material layer and forming a metal gate electrode structure to fill the recess.

In yet another exemplary embodiment, disclosed is an integrated circuit structure that includes a semiconductor substrate, raised source and drain regions formed over the semiconductor substrate, and a replacement metal gate formed between the raised source and drain regions and over the semiconductor substrate. The integrated circuit structure further includes sidewall structures formal along sidewalls of the replacement metal gate, a first workfunction material layer formed between the sidewall structures and the replacement metal gate, and a second workfunction material layer formed underneath the replacement metal gate.

This brief summary is provided to introduce a selection of concepts in a simplified form that are further described below in the detailed description. Further, this brief summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to integrated circuit structures and methods for fabricating the same that includes raised source/drain structures integrated into a RMG process flow, and that further includes separate workfunction material layers. As used herein, the term "separate workfunction material layers" refers to a design configuration including the use of at least two workfunction material layers, wherein one of the at least two workfunction material layers is disposed only along sidewalls of, or only along an underside or, the metal gate structure. Accordingly, the metal gate structure functions with one workfunction material affecting the conduction band of the gate along the sidewalls of the gate, and the other workfunction material affecting the conduction band of the gate along its underside. It has been discovered that this configuration reduces the fringe capacitance by converting the raised source/drain region from a carrier accumulation region to a carrier depletion region.

For the sake of brevity, conventional techniques related to integrated circuit device fabrication, particularly high-k/metal gate techniques, may not be described in detail herein. Moreover, the various tasks and process steps described herein may be incorporated into a more comprehensive procedure or process having additional steps or functionality not described in detail herein. In particular, various steps in the manufacture of semiconductor-based transistors using high-k/metal gate techniques are well-known and so, in the interest of brevity, many conventional steps will only be mentioned briefly herein or will be omitted entirely without providing the well-known process details.

Figure 1:
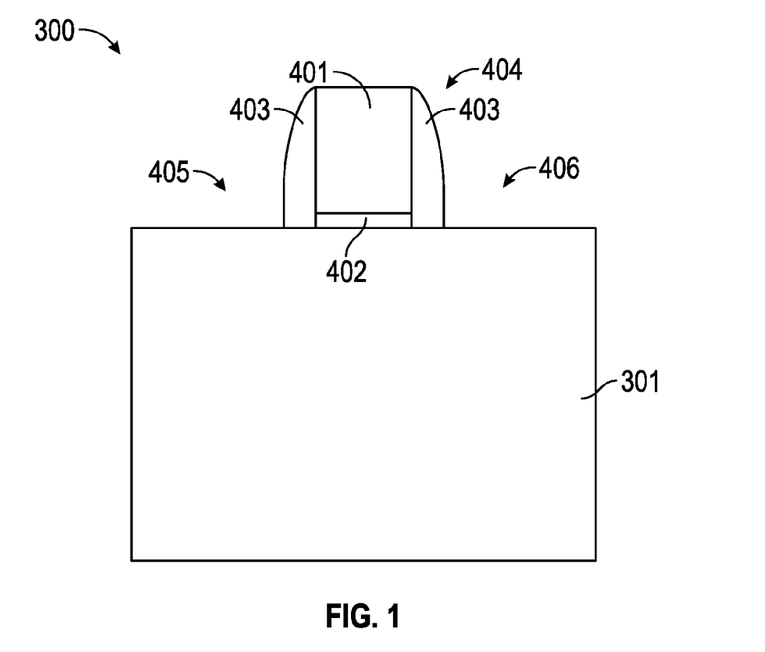
FIGS. 1-10 illustrate, in cross section, integrated circuit structures and methods for fabricating integrated circuits in accordance with one embodiment of the present disclosure.

FIGS. 1-10 illustrate, in cross section, integrated circuit structures and methods for fabricating integrated circuit structures with raised source/drain structures and separate workfunction material layers in accordance with one embodiment of the present disclosure. With reference first to FIG. 1, a semiconductor structure 300 includes a substrate 301 that may be formed of a semiconductor material such as silicon. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate may be a bulk silicon wafer as shown, or a silicon-on-insulator (SOI) wafer. The substrate may further include a plurality of isolation features (not shown), such as shallow trench isolation (STI) features or local oxidation of silicon (LOCOS) features.

A dummy gate insulation layer 402 and a dummy gate electrode 401 are formed on the substrate 301. The dummy gate insulation layer 402 and the dummy gate electrode 401 may be formed by depositing a layer of a material of the dummy gate insulation layer, for example, a layer of silicon dioxide, having a thickness that may be from about 2 to about 3 nm and a layer of a material of the dummy gate electrode, for example, a layer of polysilicon, having a thickness that may be from about 40 to about 60 nm by means of deposition processes such as chemical vapor deposition and/or plasma-enhanced chemical vapor deposition, and patterning the layers of the dummy gate insulation material 402 and the dummy gate electrode material 401 by means of photolithography and etching. A sidewall spacer 403 may be formed adjacent the gate electrode 401. The sidewall spacer 403 may include silicon nitride. The sidewall spacer 403 may be formed by substantially isotropically depositing a layer of the material of the sidewall spacer 403 and performing an anisotropic etch process. In some embodiments, a liner layer may be provided between the gate electrode 401 and the sidewall spacer 403. The dummy gate insulation layer 402, the dummy gate electrode 401, the sidewall spacer 403 and the optional liner layer form a gate structure 404. The gate structure 404 has a source side 405 and a drain side 406, wherein the source side 405 and the drain side 406 are located on opposite sides of the gate structure 404.

Figure 2:
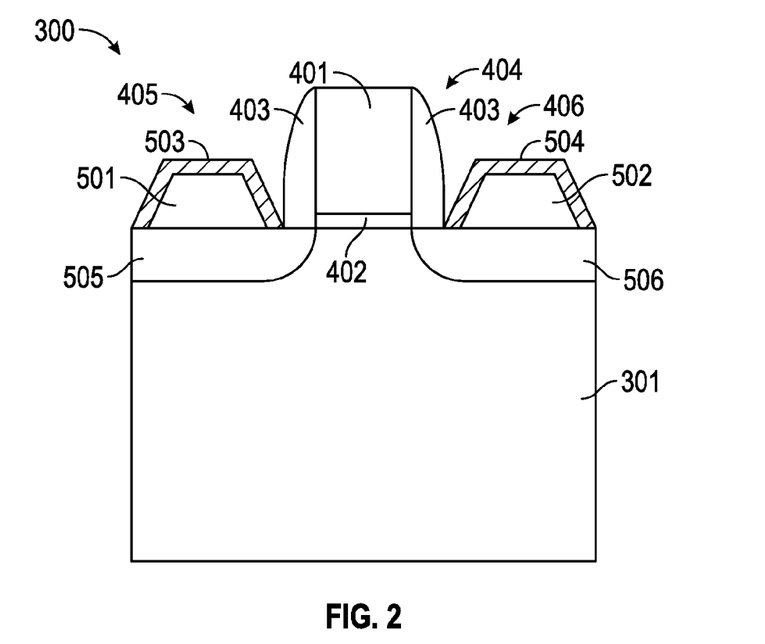

With reference now to FIG. 2, a raised source region 501 is formed on the source side 405 of the gate structure 404. On the drain side 406 of the gate structure 404, a raised drain region 502 is formed. The raised source region 501 and the raised drain region 502 may be formed by depositing an in situ doped semiconductor material on portions of the elongated substrate 301 adjacent the gate structure 404. The type of dopant in the raised source region 501 and the raised drain region 502 may correspond to a type of transistor to be formed in the semiconductor structure 300. In particular, in embodiments wherein a P-channel field effect transistor is to be formed, the raised source region 501 and the raised drain region 502 may include a P-type dopant and in embodiments wherein an N-channel field effect transistor is to be formed, the raised source region 501 and the raised drain region 502 may include an N-type dopant. The formation of the raised source region 501 and the raised drain region 502 may include a selective epitaxial growth process, wherein the material of the raised source region 501 and the raised drain region 502 is deposited on the exposed portions of the substrate 301, but substantially no deposition of material occurs on the gate structure 404. In embodiments wherein the dummy gate electrode 401 includes polysilicon, one or more encapsulation layers, for example a silicon nitride layer, may be formed on the dummy gate electrode 401 so that substantially no deposition of material or only a deposition of a small amount of material occurs on the dummy gate electrode 401.

After the formation of the raised source region 501 and the raised drain region 502, an anneal process may be performed for diffusing dopants from the raised source region 501 and the raised drain region 502 into portions of the semiconductor substrate 301 adjacent the gate structure 404. Thus, a source region 505 and a drain region 506 may be formed in the substrate 301. Since dopants from the raised source region 501 and the raised drain region 502 may diffuse downward and laterally from the raised areas, portions of the source region 505 and the drain region 506 may extend below the gate structure 404. Thus, in the anneal process, doped source and drain regions 505, 506 may be formed in the substrate 301 without an ion implantation process which might lead to an amorphization of the semiconductor material of the substrate 301. Before the anneal process, or at least before the formation of the raised source region 501 and the raised drain region 502, dopant concentrations in the portions of the elongated semiconductor lines wherein the source region 505 and the drain region 506 will be formed in the anneal process may be substantially equal to dopant concentrations in portions of the semiconductor substrate 301 below the gate structure 404 wherein a channel region is provided, or alternatively this area may be substantially undoped.

In some embodiments, silicide regions 503, 504 may be formed in the raised source region 501 and the raised drain region 502. For this purpose, a metal layer may be deposited over the semiconductor structure 300, and an anneal process may be performed for initiating a chemical reaction between the metal of the metal layer and the semiconductor material of the raised source region 501 and the raised drain region 502. For this purpose, a layer of a metal, such as nickel, cobalt, platinum, titanium, tungsten or an alloy of nickel and platinum, may be deposited over the semiconductor structure 300, and a further annealing process may be performed for inducing a chemical reaction between the metal and the semiconductor material in the raised source and drain regions 501, 502. Thereafter, residuals of the metals which have not reacted with semiconductor material may be removed by an etch process. The silicide regions 503, 504 may provide a lower contact resistance between the transistor and electrical contacts for connection to the transistor, compared to embodiments wherein no silicide regions are formed. The polysilicon of the dummy gate electrode 401 may be protected by an encapsulation during the formation of the silicide, so that no silicide is formed in the dummy gate electrode 401.

Figure 3:
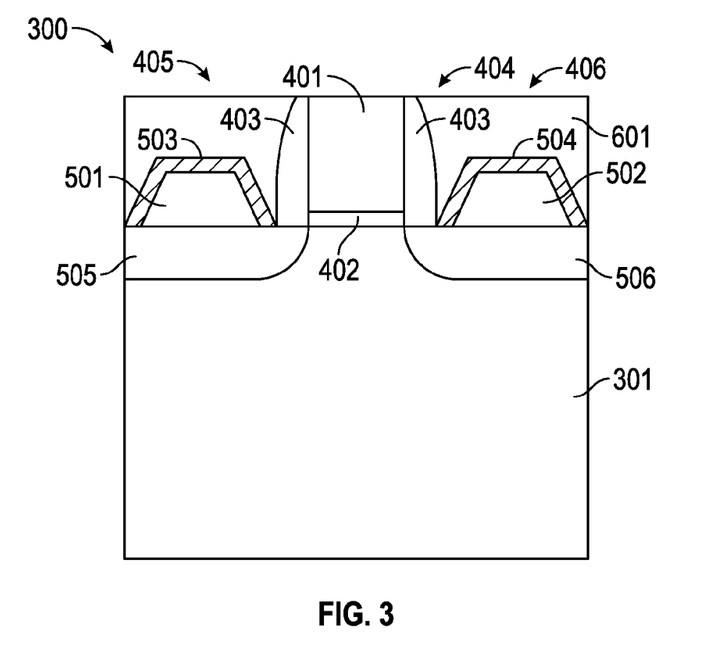

With reference now to FIG. 3, after the formation of the silicide regions 503, 504, a dielectric layer 601 may be formed on the semiconductor structure 300. In some embodiments, the dielectric layer 601 may include silicone dioxide, and may be formed by means of a chemical vapor deposition process or a plasma-enhanced chemical vapor deposition process wherein tetraethyl orthosilicate (TEOS) is used as a reactant. After the formation of the dielectric layer 601, a planarization process, for example a chemical mechanical polishing process, may be performed for providing a substantially planar surface of the semiconductor structure 300 and for exposing the dummy gate electrode 401. In some embodiments wherein an encapsulation including silicon dioxide and/or silicon nitride is provided on the dummy gate electrode 401, the encapsulation may also be removed during the chemical mechanical polishing process.

Figure 4:
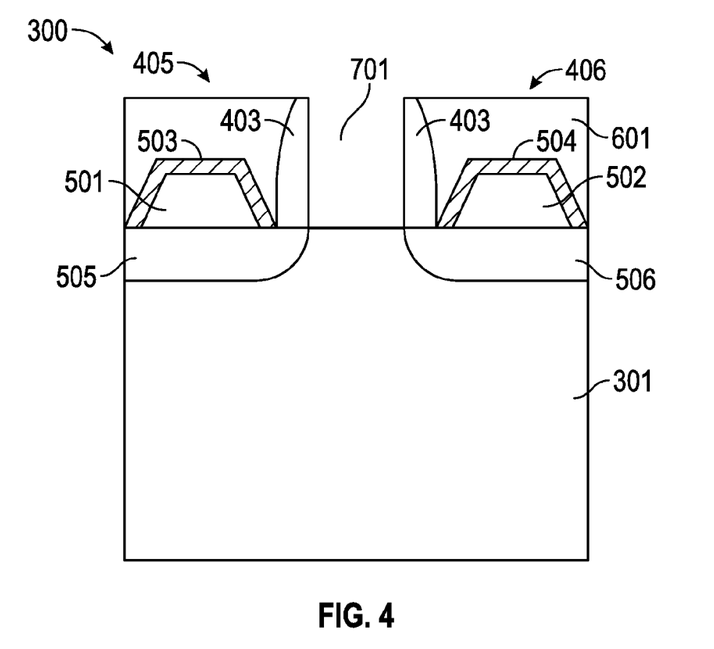

With reference now to FIG. 4, after the planarization process wherein the dummy gate electrode 401 is exposed, the dummy gate electrode 401 and the dummy gate insulation layer 402 may be removed. This may be done by means of a first etch process adapted to selectively remove the material of the dummy gate electrode 401 relative to the material or materials of the dielectric layer 601 and the dummy gate insulation layer 402 and a second etch process adapted to selectively remove the material of the dummy gate insulation layer 402 relative to the material of the semiconductor substrate 301. The removal of the dummy gate electrode 401 and the dummy gate insulation layer 402 forms a recess 701 in the semiconductor structure 300. At the bottom of the recess 701, a portion of the semiconductor substrate 301 is exposed.

Figure 5:
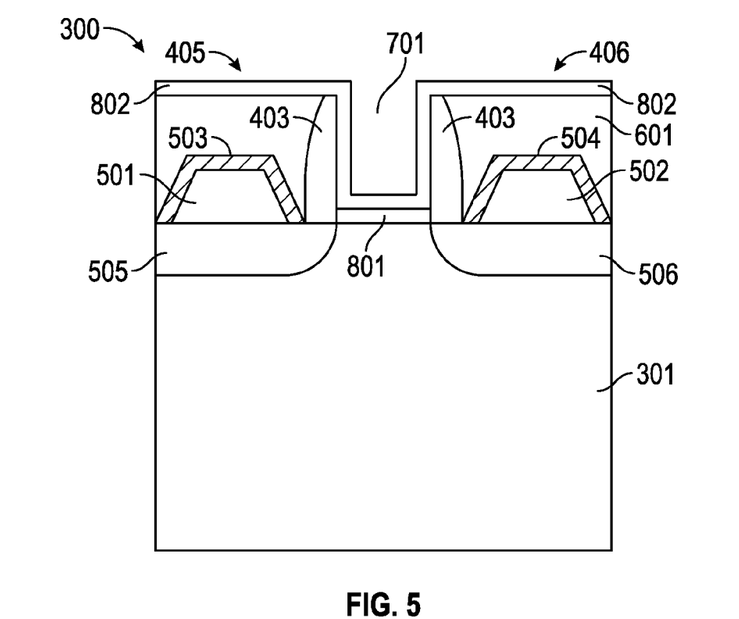

With reference now to FIG. 5, after the formation of the recess 701, a gate insulation layer 801 may be formed in the recess 701. For this purpose, a deposition process may be performed for depositing one or more materials of the gate insulation layer 801 over the semiconductor structure. The deposition process may be anisotropic deposition processes, so that substantially no or only a small amount of the material of the gate insulation layer 801 is deposited on sidewalls of the recess 701. The gate insulation layer 801 may include a high-k material having a greater dielectric constant than silicon dioxide, for example a dielectric constant greater than four. In some embodiments, the gate insulation layer 801 may include hafnium dioxide and/or hafnium silicon oxynitride.

Furthermore, as additionally shown in FIG. 5, a first workfunction material layer 802 is deposited over the high-k layer 801. In one example, the integrated circuit to be formed can be of the n-type, i.e., an nFET. As such, the first workfunction material layer 802 may be of an n-type workfunction material. Any material that is on the n-side of the band-gap, and can be deposited using a process that provides for conformal deposition, can be employed as the workfunction material. For example, CVD may be used for the deposition of such material. In one embodiment, the n-type workfunction material is TaC. TaC has a workfunction of 4.1 electron volts (eV), and is suitable for use in a CVD process. Of course, many other n-type workfunction materials can be used. These include, but are not limited to, Ti, Y, Mn, and Er. In another example, the integrated circuit to be formed can be of the p-type, i.e., a pFET. As such, the first workfunction material 802 may be a p-type workfunction material. Any material that is on the p-side of the band-gap, and can be deposited using a process that provides for conformal deposition, for example ALD, may be used for the workfunction material. In one embodiment, the p-type workfunction material is TiN. TiN has a workfunction of 5.2 eV, and is suitable for use in an ALD processes. Of course, many other p-type workfunction materials can be used. These include, but are not limited to, Pt, Ir, and Ni. The first workfunction material layer 802 is deposited over the upper surface of ILD 601, along the sidewalls of recess 701, as well as along the bottom of recess 701 (i.e., over high-k layer 801).

Figure 6:
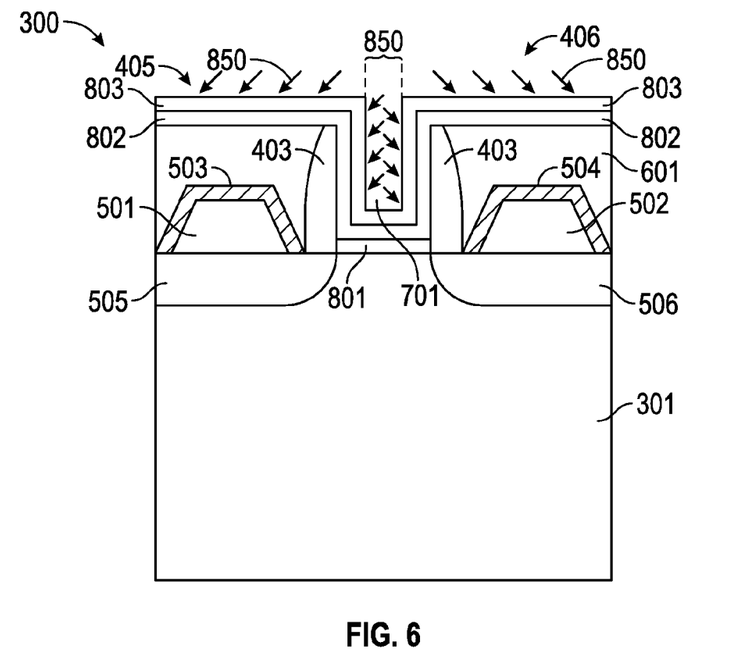

With reference now to FIG. 6, a masking layer 803 may be deposited over the first workfunction material layer 802. The masking layer 803 may include an $SiO_2$, SiN, or SiC based material. The masking layer 803 is deposited over the upper surface of ILD 601, along the sidewalls of recess 701, as well as along the bottom of recess 701 (i.e., over high-k layer 801). Thereafter, a "tilted implant" of etch rate-determining ions procedure may be performed to affect the etch rate of the material layers 802 and 803. The tilted implant of ions is represented by arrows 850 in FIG. 6. In particular, the tilted implant effects an asymmetric modification of the etch rate behavior of the material layers 802, 803 to which the implant ions are exposed. Namely, as shown in FIG. 6, according to the tilt angle α, the etch rate effect is primarily imposed upon the sidewalls of the recess 701, and also necessarily the upper surface above ILD layer 601. Accordingly, the only portion of structure 300 left unaffected by the tilted ion implant 850 is the bottom portion of the recess 701, which remains without exposure to the implanted ion species.

Figure 7:
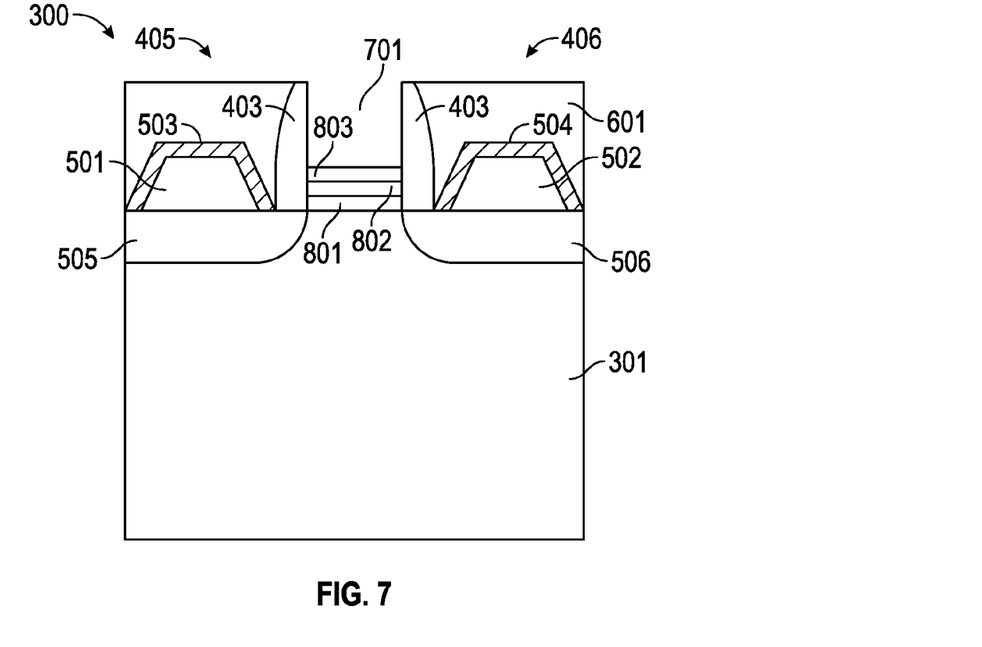

Thereafter, upon etching of the ion-affected structure shown in FIG. 6, and with reference now to FIG. 7, an increased etch rate is exhibited upon the surfaces affected by the ion implantation, namely the surfaces above ILD layer 601, in addition to the sidewall surfaces along recess 701. Accordingly, due to the tilted implant procedure described above, and the subsequent etching process, the first workfunction material layer 802 and the masking layer 803 are etched from above the ILD layer 601 and from the sidewalls of recess 701. Accordingly, what remains, as shown in FIG. 7, are the layers 802 and 803 at the bottom of recess 701, but not along the sidewalls thereof.

Figure 8:
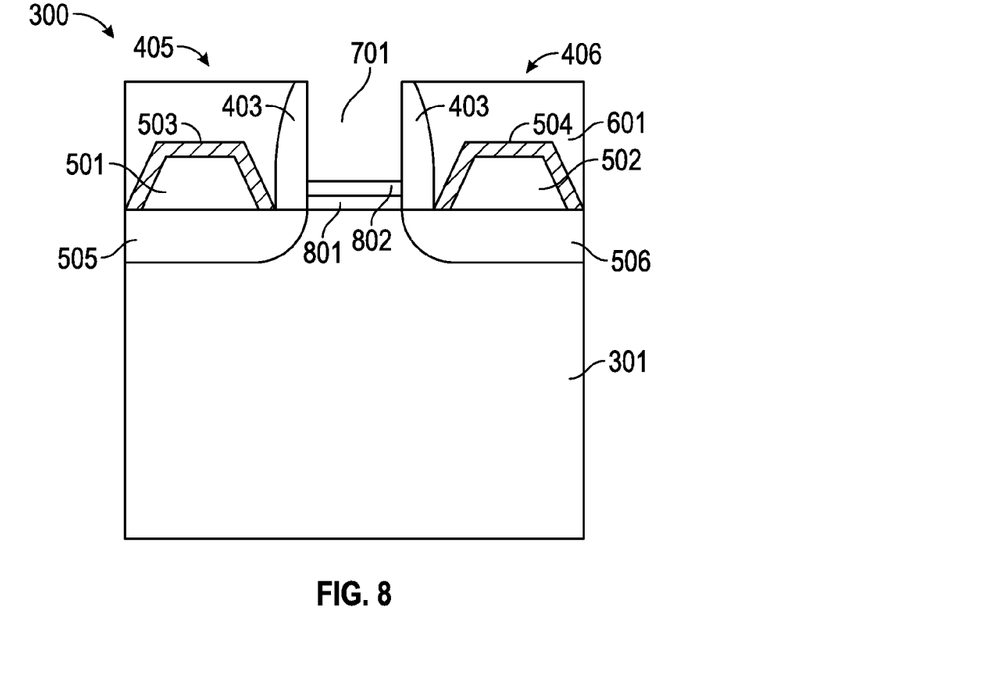

With continued reference now to FIG. 8, the exemplary process continues with a step of removing the masking layer 803 from the bottom of recess 701. This leaves, at the bottom of recess 701, the first workfunction material layer 802 and the high-k material layer therebelow. The sidewalls of recess 701 and the surface above ILD layer 601 have been cleared (etched) of the aforesaid layers.

Figure 9:
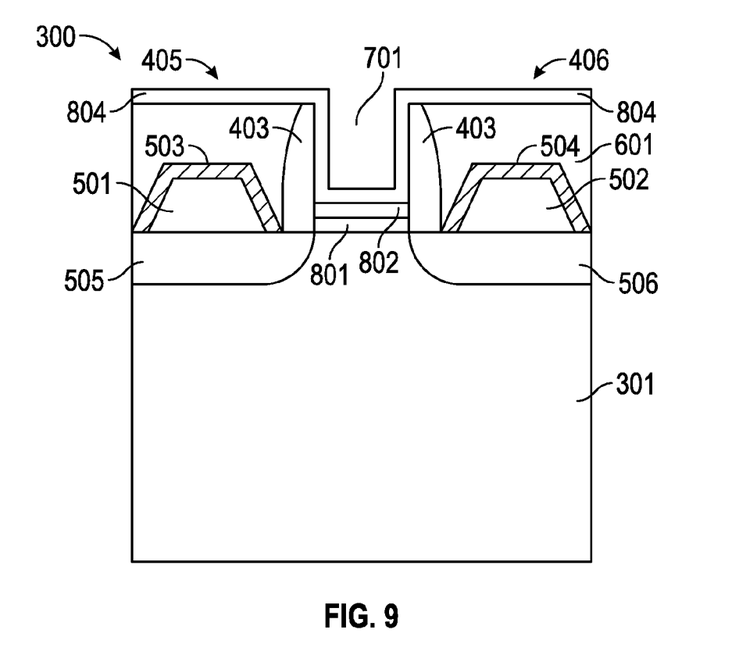

Thereafter, with reference now to FIG. 9, a second workfunction material layer 804 is deposited over the integrated circuit structure 300, namely over the ILD layer 601, along the sidewalls of recess 701, and at the bottom of recess 701 over the first workfunction material layer 801 and over the high-k layer 801. The second workfunction material may be different from the first workfunction material. The workfunction material selected for the second workfunction material layer 804 may be consistent with the material selected for the first workfunction material layer 802, and in particular whether a P-type FET or an N-type FET is desired. Appropriate materials therefor were listed above. Further, in an exemplary embodiment, the workfunction layers 802, 804 are provided as follows: Layer 802 is deposited to a thickness of about 1 nm to about 2 nm, for example about 1 nm. Layer 804 is deposited to a thickness of about 3 nm to about 7 nm, for example about 5 nm. Of course, other thicknesses of the layers 802, 804 may be suitable in an embodiment.

Figure 10:
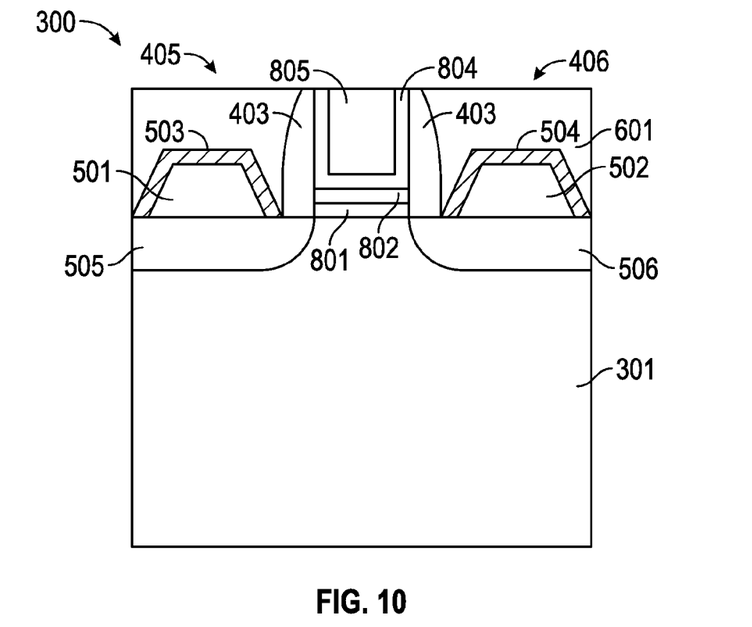
Figure 11:
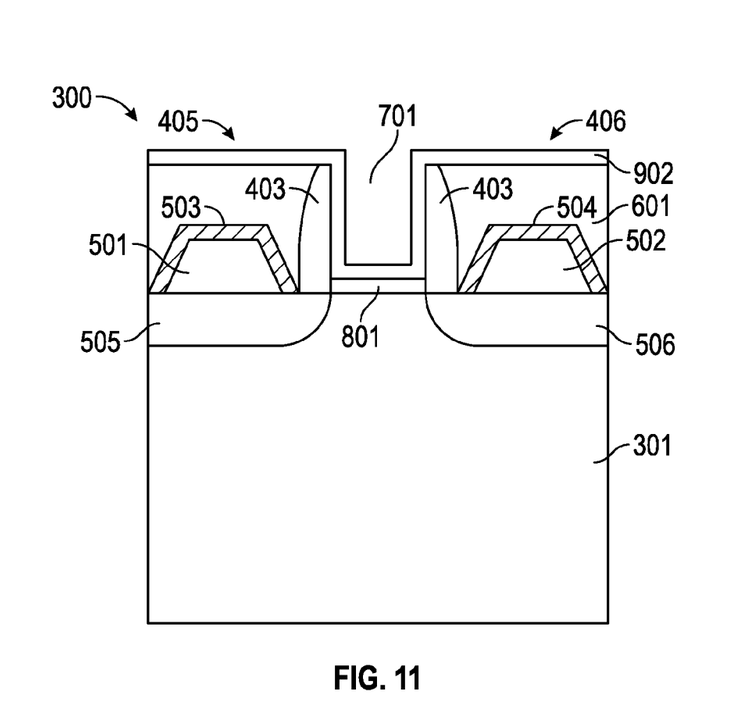
FIGS. 11-16 illustrate, in cross section, integrated circuit structures and methods for fabricating integrated circuits in accordance with another embodiment of the present disclosure.

With reference now to FIG. 10, after the second workfunction material layer 804 has been formed, a gate electrode 805 may be formed in the recess 701. For this purpose, one or more deposition processes may be performed for depositing one or more materials of the gate electrode 805 over the semiconductor structure 300. The deposition processes may be anisotropic deposition processes. The gate electrode 805 may include a metal having a work function adapted to the particular type or characteristic of the transistor to be formed, in conjunction with the separate workfunction material layers 802, 804 previously formed. In some embodiments, different metals may be used for P-type transistors and N-type transistors formed in different portions of the semiconductor structure 300. In some embodiments, the entire gate electrode 805 may be formed of a metal. In other embodiments, the gate electrode 805 may include a metal portion and a polysilicon portion. After the deposition of the material or materials of the gate electrode 805, a planarization process, for example a chemical mechanical polishing process, may be performed for removing material of the gate electrode that has been deposited on the dielectric layer 601.

Thereafter, the integrated circuit may be completed using known "middle-of-the-line" (MOL) processes and "back-end-of-the-line" (BEOL) processes, including for example the formation of metal contact structures to the raised source/drain regions 501, 502 and to the metal gate electrode 805, and the formation of further metallization layers over the semiconductor structure 300, among various other steps. The present disclosure is not intended to exclude any such further processes as are conventional in the fabrication of conventional integrated circuits and semiconductor chips. Accordingly, as is shown in FIG. 10, the workfunction material layers 802, 804 are "separate" from one another as a result of the first workfunction material layer 802 being disposed on the "underside" of gate 805, and the second workfunction material layer 804 being disposed on the "sidewalls" of gate 805 (but first workfunction material layer 802 is not disposed on the sidewalls of gate 805).

FIGS. 11-16 illustrate, in cross section, integrated circuit structures and methods for fabricating integrated circuit structures with raised source/drain structures and separate workfunction material layers in accordance with another embodiment of the present disclosure. In particular, FIG. 11 begins at a point in the semiconductor fabrication process flow that is after FIG. 4, as described above. Accordingly, repeated description of the process with regard to FIGS. 1-4 is omitted for succinctness, and the reader is directed to FIG. 11 with an understanding of the disclosure previously presented with regard to FIGS. 1-4. As such, with attention now to FIG. 11, a gate insulation layer 801 may be formed in the recess 701. For this purpose, a deposition process may be performed for depositing one or more materials of the gate insulation layer 801 over the semiconductor structure. Thereafter, a first workfunction material 902 is deposited over the high-k layer 801. In one example, the integrated circuit to be formed can be of the n-type, i.e., an nFET. As such, the first workfunction material layer 902 may be of an n-type workfunction material. Any material that is on the n-side of the band-gap, and can be deposited using a process that provides for conformal deposition, can be employed as the workfunction material. For example CVD may be used for the deposition of such material. In one embodiment, the n-type workfunction material is TaC. TaC has a workfunction of 4.1 electron volts (eV), and is suitable for use in a CVD process. Of course, many other n-type workfunction materials can be used. These include, but are not limited to, Ti, Y, Mn, and Er. In another example, the integrated circuit to be formed can be of the p-type, i.e., a pFET. As such, the first workfunction material 902 may be a p-type workfunction material. Any material that is on the p-side of the band-gap, and can be deposited using a process that provides for conformal deposition, for example ALD, may be used for the workfunction material. In one embodiment, the p-type workfunction material is TiN. TiN has a workfunction of 5.2 eV, and is suitable for use in an ALD processes. Of course, many other p-type workfunction materials can be used. These include, but are not limited to, Pt, Ir, and Ni. The first workfunction material layer 902 is deposited over the upper surface of ILD 601, along the sidewalls of recess 701, as well as along the bottom of recess 701 (i.e., over high-k layer 801).

Figure 12:
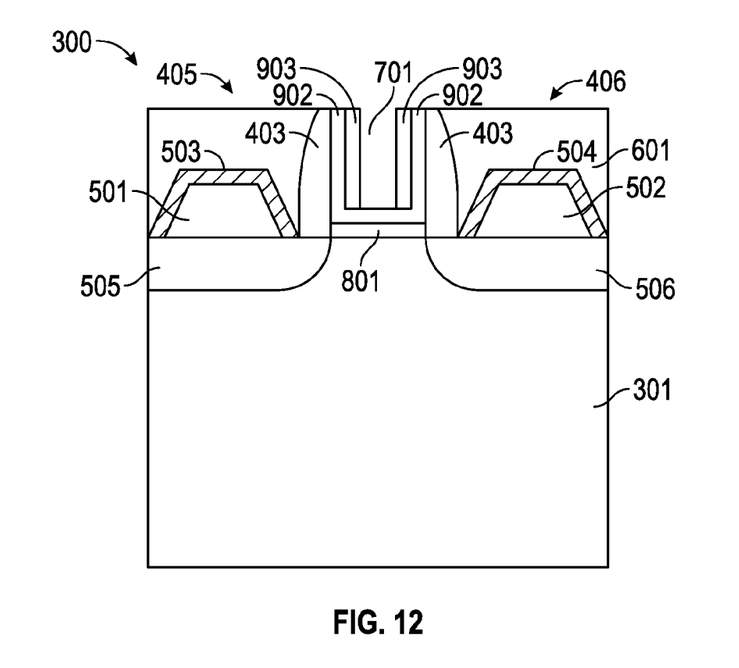

With reference now to FIG. 12, a sidewall spacer 903 may be formed over the first workfunction material layer 902 and adjacent to the sidewalls of recess 701. The sidewall spacer 903 may include silicon nitride. The sidewall spacer 903 may be formed by substantially isotropically depositing a layer of the material of the sidewall spacer 903 and performing an anisotropic etch process. As such, with regard to FIG. 12, the recess 701 has formed therein a first workfunction material layer 902 along the sidewalls and the bottom thereof, in addition to a spacer 903 along just the sidewalls thereof. In particular, the aforesaid etch process removes the spacer material from above the ILD layer 601, as well as from the bottom of the recess 701, leaving the spacers 903 only along the sidewalls of the recess 701, over the first workfunction material layer 902.

Figure 13:
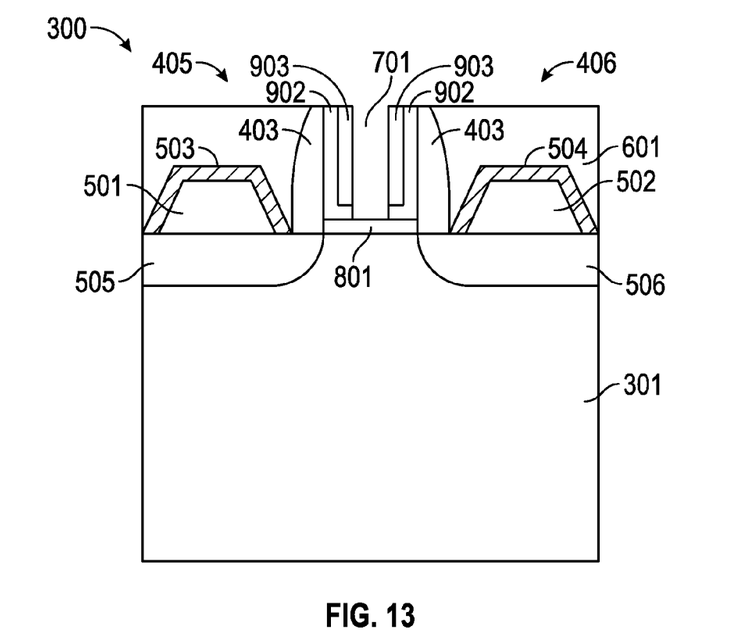
Figure 14:
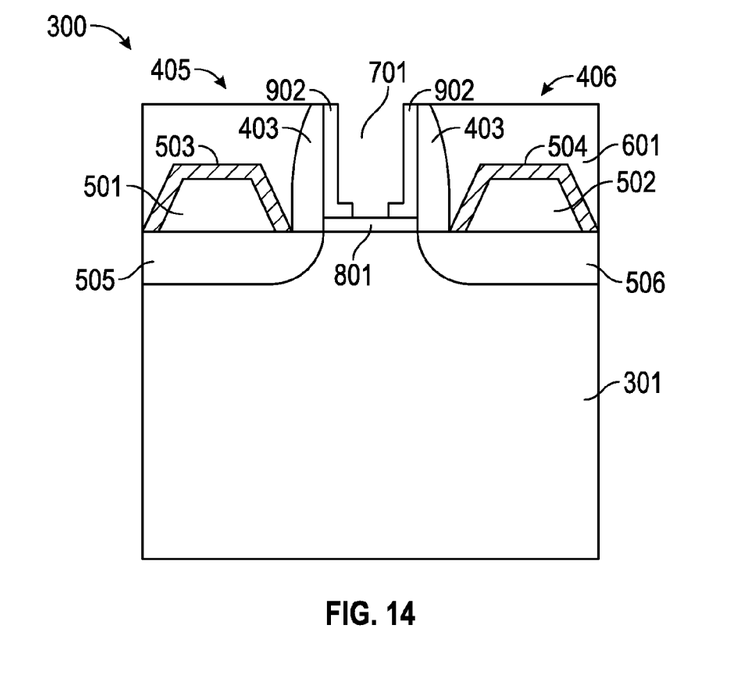

Still a further anisotropic etch process, as shown in FIG. 13, may remove the portion of the first workfunction material layer 902 from the bottom of the recess 701, thereby leaving the high-k material layer 801 exposed at the bottom of the recess 701. As the etch is anisotropic, unchanged along the sidewalls of the recess 701 is the spacer 903 and the first workfunction material layer 902 thereunderneath. With further attention now to FIG. 14, the spacer structures 903 may be removed from the sidewalls of recess 701 using an appropriately-selective etching process, as is known in the art. This leaves, as is shown in FIG. 14, the sidewalls of recess 701 occupied only by the first workfunction material 902, and the bottom thereof occupied only by the high-k material 801.

Figure 15:
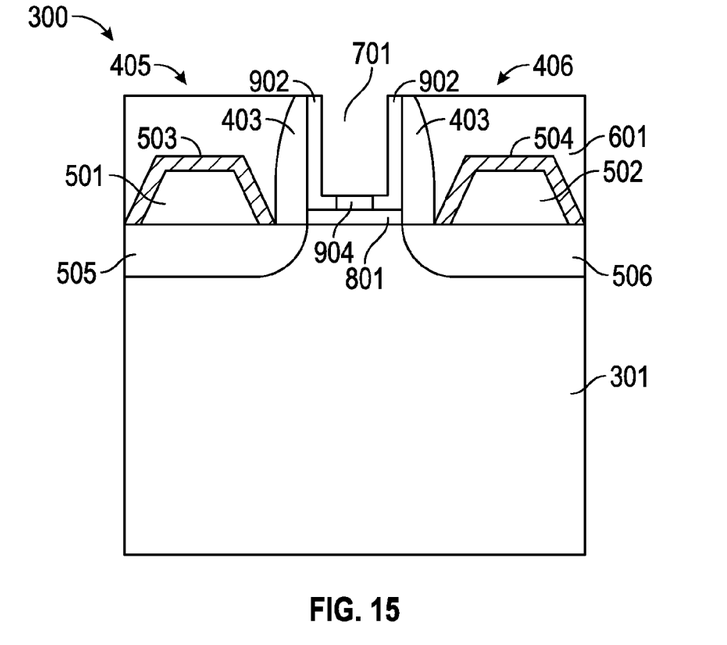

With reference now to FIG. 15, a second workfunction material 904 may be deposited over the high-k material layer 801. The second workfunction material 904 may be deposited using a suitable photolithographic patterning and etching process, wherein a photoresist material is patterned so as to allow the deposition of the second workfunction material 904 only over the high-k material layer 801 (and not over the ILD layer 601 or along the sidewalls of recess 701). The workfunction material selected for the second workfunction material layer 904 may be consistent with the material selected for the first workfunction material layer 902, and in particular whether a P-type FET or an N-type FET is desired. Appropriate materials therefor were listed above. Further, in an exemplary embodiment, the workfunction layers 902, 904 are provided as follows: Layer 902 is deposited to a thickness of about 1 nm to about 2 nm, for example about 1 nm. Layer 904 is deposited to a thickness of about 3 nm to about 7 nm, for example about 5 nm. Of course, other thicknesses of the layers 902, 904 may be suitable in an embodiment.

Figure 16:
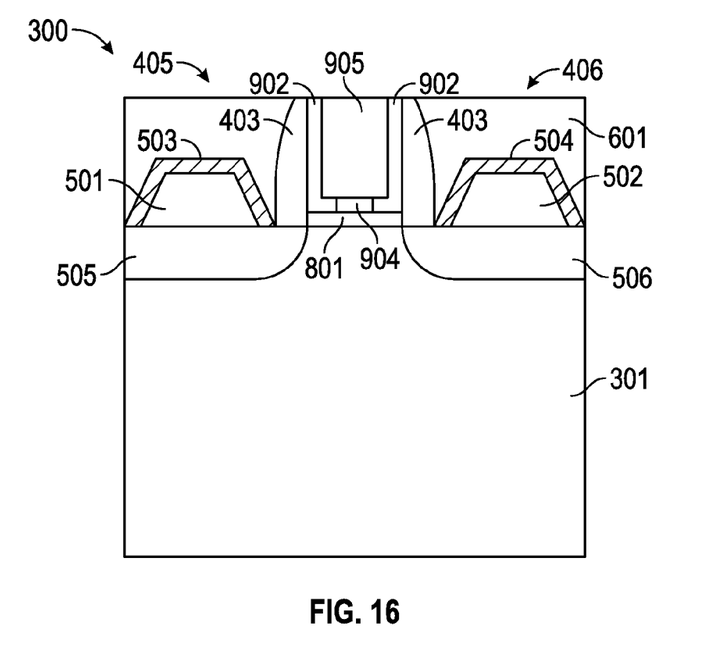

With reference now to FIG. 16, after the second workfunction material layer 904 has been formed, a gate electrode 905 may be formed in the recess 701. The second workfunction material may be different from the first workfunction material. For this purpose, one or more deposition processes may be performed for depositing one or more materials of the gate electrode 905 over the semiconductor structure 300. The deposition processes may be anisotropic deposition processes. The gate electrode 905 may include a metal having a work function adapted to the particular type or characteristic of the transistor to be formed, in conjunction with the separate workfunction material layers 902, 904 previously formed. In some embodiments, different metals may be used for P-type transistors and N-type transistors formed in different portions of the semiconductor structure 300. In some embodiments, the entire gate electrode 905 may be formed of a metal. In other embodiments, the gate electrode 905 may include a metal portion and a polysilicon portion. After the deposition of the material or materials of the gate electrode 905, a planarization process, for example a chemical mechanical polishing process, may be performed for removing material of the gate electrode that has been deposited on the dielectric layer 601.

Thereafter, the integrated circuit may be completed using known "middle-of-the-line" (MOL) processes and "back-end-of-the-line" (BEOL) processes, including for example the formation of metal contact structures to the raised source/drain regions 501, 502 and to the metal gate electrode 905, and the formation of further metallization layers over the semiconductor structure 300, among various other steps. The present disclosure is not intended to exclude any such further processes as are conventional in the fabrication of conventional integrated circuits and semiconductor chips. Accordingly, as is shown in FIG. 10, the workfunction material layers 902, 904 are "separate" from one another as a result of the first workfunction material layer 902 being disposed on the "sidewalls" of gate 905, and the second workfunction material layer 904 being disposed on the "underside" of gate 905 (but first workfunction material layer 902 is not disposed on the underside of gate 905).

Accordingly, novel integrated circuit structures and methods for fabricating the same have been disclosed. The disclosed embodiments provide separate workfunction material layers in a replacement metal gate process flow with raised source/drain regions, including the use of at least two workfunction material layers, wherein one of the at least two workfunction material layers is disposed only along sidewalls of, or only along an underside or, the metal gate structure. The metal gate structure functions with one workfunction material affecting the conduction band of the gate along the sidewalls of the gate, and the other workfunction material affecting the conduction band of the gate along its underside. This configuration reduces the fringe capacitance by converting the raised source/drain region from carrier accumulation region to a carrier depletion region. Accordingly, the disclosed embodiments avoid the undesirable fringe capacitance that has been experienced in prior art techniques and structures. Additionally, the disclosed embodiments provide methods for the fabrication of such structures that are easily integrated into existing process flow schemes used in semiconductor fabrication facilities.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of fabricating an integrated circuit comprising:
    forming raised source and drain regions adjacent to a dummy gate electrode structure upon a semiconductor substrate, the dummy gate electrode structure being formed between sidewalls spacer structures and an inter layer dielectric (ILD) layer upon the semiconductor substrate;
    removing the dummy gate electrode structure to form a recess between the sidewall spacer structures and exposing a high-k material layer at a bottom portion of the recess;
    forming a first workfunction material layer over the ILD layer, along the sidewall spacer structures, and over the high-k material layer;
    forming a masking layer over the first workfunction material layer;
    performing a tilted ion implant wherein ions are implanted at the masking layer over the ILD layer and along the sidewall spacer structures, while leaving the bottom portion of the recess free from the tilted ion implant;
    selectively etching the masking layer and the first workfunction material from over the ILD layer and from along the sidewall spacer structures, thereby leaving the first workfunction material layer disposed only over the high-k material layer at the bottom portion of the recess;
    forming a second workfunction material layer over the ILD layer, along the sidewall spacer structures, and over the first workfunction material layer; and
    forming a metal gate electrode structure to fill the recess.

2. The method of claim 1, further comprising forming a silicide over the raised source/drain regions.

3. The method of claim 1, wherein the raised source/drain regions are formed by a selective epitaxial growth process.

4. The method of claim 1, wherein the dummy gate electrode structure has sidewall spacer structures formed therealong.

5. The method of claim 1, wherein the dummy gate electrode structure is formed of a polycrystalline silicon material.

6. The method of claim 1, wherein forming the first workfunction material layer comprises forming an n-type or a p-type workfunction material layer.

7. The method of claim 1, wherein forming the masking layer over the first workfunction material layer comprise forming a layer comprising SiC, SiN, or $SiO_2$.

8. The method of claim 1, further comprising planarizing the integrated circuit after forming the metal gate electrode structure such that an upper surface of the metal gate electrode structure and an upper surface of the ILD layer are coplanar.

9. A method of fabricating an integrated circuit comprising:
    forming raised source and drain regions adjacent to a dummy gate electrode structure upon a semiconductor substrate, the dummy gate electrode structure being formed between first sidewalls spacer structures and an inter layer dielectric (ILD) layer upon the semiconductor substrate;
    removing the dummy gate electrode structure to form a recess between the first sidewall spacer structures and exposing a high-k material layer at a bottom portion of the recess;
    forming a first workfunction material layer over the ILD layer, along the first sidewall spacer structures, and over the high-k material layer;
    forming second sidewall spacer structures along the first workfunction material layer, leaving the first workfunction material layer exposed at a bottom portion of the recess;
    removing the first workfunction material layer from the bottom portion of the recess to re-expose the high-k material layer;
    removing the second sidewall spacer structures;
    forming a second workfunction material layer over the high-k material layer; and
    forming a metal gate electrode structure to fill the recess.

10. The method of claim 9, further comprising forming a silicide over the raised source/drain regions.

11. The method of claim 9, wherein the raised source/drain regions are formed by a selective epitaxial growth process.

12. The method of claim 9, wherein the dummy gate electrode structure has sidewall spacer structures formed therealong.

13. The method of claim 9, wherein the dummy gate electrode structure is formed of a polycrystalline silicon material.

14. The method of claim 9, wherein forming the first workfunction material layer comprises forming an n-type or a p-type workfunction material layer.

15. The method of claim 9, wherein forming the second sidewall spacer structures comprises forming a SiN material layer.

16. The method of claim 9, further comprising planarizing the integrated circuit after forming the metal gate electrode structure such that an upper surface of the metal gate electrode structure and an upper surface of the ILD layer are coplanar.

17. An integrated circuit structure comprising:
    a semiconductor substrate;
    raised source and drain regions formed over the semiconductor substrate;

a replacement metal gate formed between the raised source and drain regions and over the semiconductor substrate;
sidewall structures formal along sidewalls of the replacement metal gate;
a first workfunction material layer formed between the sidewall structures and the replacement metal gate; and
a second workfunction material layer formed underneath the replacement metal gate,
wherein at least one of the first workfunction material layer and the second workfunction material layer is only formed between the sidewall structures, and not underneath the replacement metal gate.

18. The integrated circuit of claim 17, wherein the first workfunction material layer is only formed underneath the replacement metal gate, and not between the sidewall structures and the replacement metal gate.

19. The integrated circuit of claim 17, wherein the second workfunction material layer is only formed underneath the replacement metal gate, and not between the sidewall structures and the replacement metal gate.

20. The integrated circuit of claim 17, further comprising a high-k material layer formed underneath the second workfunction material layer and above the semiconductor substrate.

* * * * *